(12) United States Patent
Yamane et al.

(10) Patent No.: US 7,446,594 B2
(45) Date of Patent: Nov. 4, 2008

(54) BOOSTER CIRCUIT INCLUDING AN OSCILLATOR

(75) Inventors: Kazunori Yamane, Kanagawa (JP);
Akira Satou, Kanagawa (JP); Toshiharu Okamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 142 days.

(21) Appl. No.: 11/496,398

(22) Filed: Aug. 1, 2006

(65) Prior Publication Data
US 2007/0030082 A1    Feb. 8, 2007

(30) Foreign Application Priority Data
Aug. 3, 2005    (JP) ............................. 2005-225576

(51) Int. Cl.
*G05F 3/02* (2006.01)
*G05F 1/10* (2006.01)
(52) U.S. Cl. ...................... 327/536; 327/148; 327/157; 327/537; 363/59; 363/60; 331/57
(58) Field of Classification Search .............. 327/148, 327/157, 536, 537; 363/59, 60; 331/57
See application file for complete search history.

(56) References Cited

U.S. PATENT DOCUMENTS 7,173,478 B2 * 2/2007 Chun ......................... 327/536
2008/0012647 A1 * 1/2008 Risbo et al. ................... 331/16

FOREIGN PATENT DOCUMENTS

JP    11-25673    1/1999

* cited by examiner

*Primary Examiner*—Kenneth B Wells
*Assistant Examiner*—Brandon S Cole
(74) *Attorney, Agent, or Firm*—Young & Thompson

(57) ABSTRACT

Disclosed is a booster circuit comprising a voltage detection circuit for outputting a decision output signal for detecting a boosted voltage and controlling a voltage boosting operation, an oscillation circuit, and a plurality of charge pump circuits. The oscillation circuit includes an odd number of stages of control-type inverters. When the decision output signal from the voltage detection circuit indicates the voltage boosting operation (oscillation), the odd number of stages of inverters constitute a closed path. Oscillation outputs from outputs of the control-type inverters are thereby extracted, respectively. When the decision output signal indicates a stop of the voltage boosting operation (stop of the oscillation), output values of the control-type inverters are not inverted and held, and the oscillation is thereby stopped. The charge pump circuits receive output signals from the control-type inverters as clock signals, respectively, and operate.

15 Claims, 9 Drawing Sheets

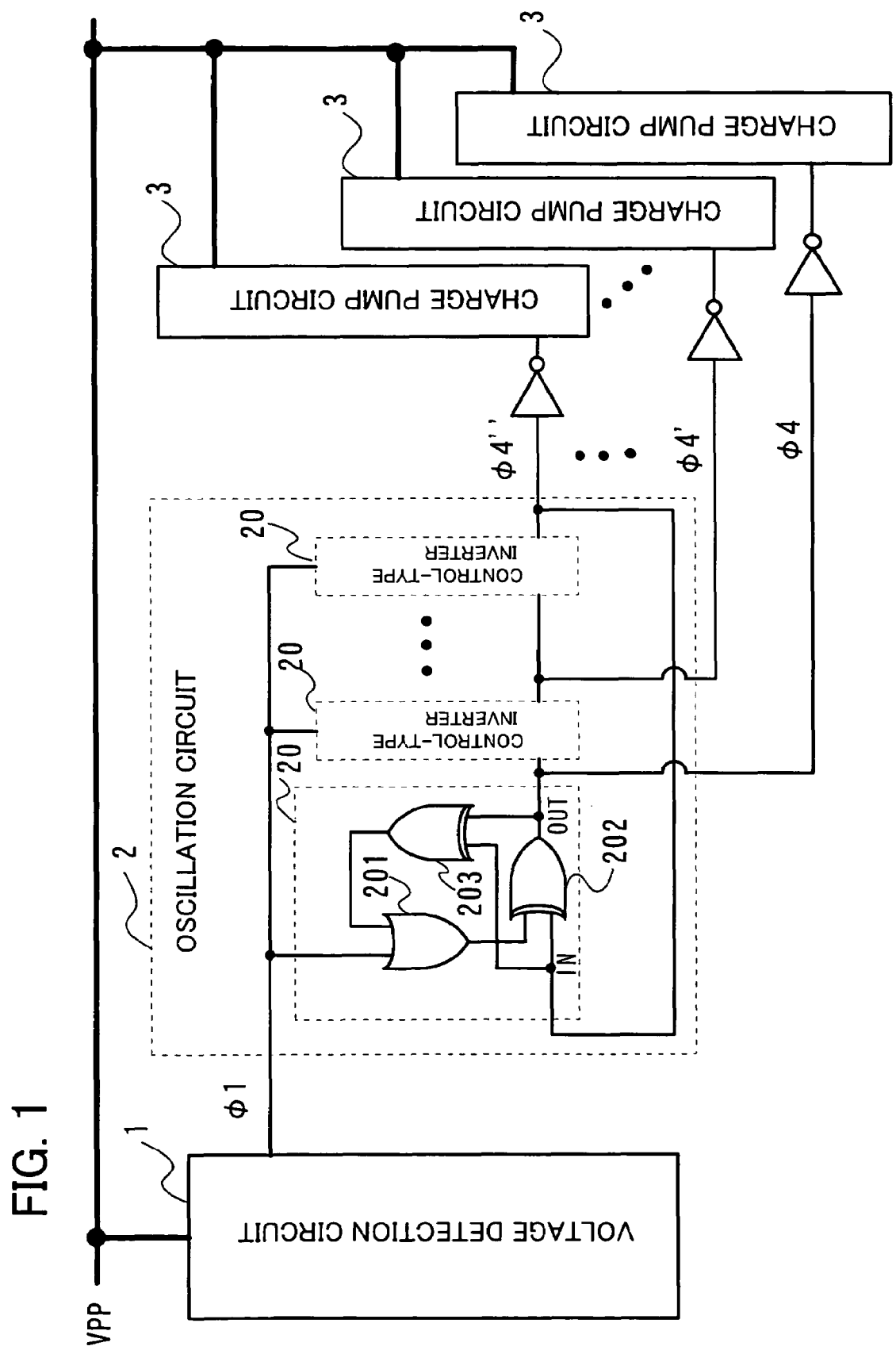

| φ1 | IN | OUT |
|----|----|----|
| 1  | 1  | 0  |
| 1  | 0  | 1  |
| 0  | x  | OUT0 |

BOOSTER CIRCUIT INCLUDING AN OSCILLATOR

FIELD OF THE INVENTION

The present invention relates to a semiconductor device. More specifically, the invention relates to a booster circuit suitable for being applied to generation of a boosted voltage for a semiconductor memory or the like and the semiconductor device including the booster circuit.

BACKGROUND OF THE INVENTION

In memory circuits such as a non-volatile memory, it is necessary to generate a high voltage for performing programming or reading of data in a memory cell.

In case the high voltage is generated using a common booster circuit, a drop in a supply voltage will be brought about, when an amount of current at a time of voltage boosting exceeds supply capability of a power source. Accordingly, it becomes necessary to perform distribution of peak current.

As one of techniques for achieving this, a technique of changing a phase of a control clock signal for each charge pump in order to control a plurality of charge pump circuits has been traditionally used a lot. However, a scheme for coping with a delay in the course of generating a phase difference and simultaneous phase changes of the control clock signals at a time of starting and ending the voltage boosting becomes necessary.

Patent Document 1 discloses a configuration of a booster circuit as shown in FIG. 5, in which a peak current generated by overlapping of noise at a time of cell data amplification with noise caused by an operation of the booster circuit is distributed, thereby stabilizing the cell data amplification. Referring to FIG. 5, this booster circuit includes a voltage detection circuit 1 for detecting a boosted voltage and outputting a decision output signal $\phi1$ that controls a boosting operation, an oscillation circuit 21 for performing oscillation upon receipt of control by the decision output signal $\phi1$ from the voltage detection circuit 1 and outputting an output signal $\phi2$, a plurality of control circuits 5 that receives respective output signals of the voltage detection circuit 1 and the oscillation circuit 21, for controlling charge pump circuits, and a plurality of charge pump circuits 3 that operate under the control of the control circuits 5. Each control circuit 5 includes transfer gates TG2 and TG3 for receiving the output signal $\phi2$ of the oscillation circuit 21 and controlling transmission of an inverted signal thereof and the output signal $\phi2$, a first latch circuit 6 for latching a signal $\phi3$ at a connecting point between outputs of the transfer gates TG2 and TG3 for output to a charge pump circuit, a second latch circuit 7 for latching the signal $\phi3$ through a transfer gate TG4 which is on/off controlled by the decision output signal $\phi1$, and a circuit 8 for controlling the transfer gates TG2 and TG3 so that, out of a logic and an inverted logic of the output signal $\phi2$ of the oscillation circuit, the logic inverted to a logic of the signal latched by the second latch circuit 7 is selected and output, based on the signal $\phi3$ and an inverted signal $\phi3^-$ (inverted output signal of the second latch circuit 7) and the decision output signal $\phi1$ of the voltage detection circuit 1. Activation of the first latch circuit 6 is controlled by the decision output signal $\phi1$.

FIG. 8 shows an example of a configuration of the voltage detection circuit 1. Referring to FIG. 8, the voltage detection circuit 1 has a configuration in which a potential at a voltage boosting node VB is divided by resistance, for comparison with a reference voltage VREF by a comparator COMP. When the potential at the node VB is lower than a set potential determined by a resistance division ratio and the reference voltage VREF, the decision output signal $\phi1$, which is an output of the comparator goes high (indicating a voltage boosting operation). On the contrary, when the potential at the node VB is higher, the decision output signal $\phi1$ goes low (indicating no voltage boosting operation).

FIG. 9 shows an example of a configuration of the charge pump circuit 3. The configuration shown in FIG. 9 is referred to as a complementary circuit system, and is controlled by a square wave of the signal $\phi3$ in FIG. 5 (or a signal $\phi4$ in FIG. 1). Capacitors C1 and C2 operate with opposite phases.

FIGS. 6A and 6B show a timing waveform diagram explaining an operation of the configuration shown in FIG. 5. When it is determined that the boosted voltage reaches a preset voltage at the voltage detection circuit 1 as shown in FIG. 6A, the decision output signal 11 ($\phi1'$ and $\phi1''$) transitions from high to low. The control signal $\phi3$ ($\phi3'$ and $\phi3''$) for the charge pump circuit is held by the first latch circuit 6 and the second latch circuit 7. The charge pump circuit 3 is stopped. On the other hand, the output $\phi2$ ($\phi2'$ and $\phi2''$) returns to an initial state.

When it is determined that the boosted voltage does not reach the set voltage at the voltage detection circuit 1, the decision output signal $\phi1$ ($\phi1'$ and $\phi1''$) transitions from low to high. The signal $\phi3$ ($\phi3'$ and $\phi3''$) is a signal obtained on switching positive and negative logics of the output signal $\phi2$ of the oscillation circuit 21 forcefully by a level held at the second latch circuit 7. As a result, the clocking of signal $\phi3$ ($\phi3'$ or $\phi3''$) starts from a negative logic of a level held at the first latch circuit 6. An operation of the charge pump circuit 3 is resumed, and the voltage boosting operation is performed.

[Patent Document 1]
JP Patent Kokai Publication No. JP-A-11-25673

SUMMARY OF THE DISCLOSURE

In the conventional booster circuit explained with reference to FIGS. 5, 6A and 6B, the charge pump 3 are controlled by the decision output signal $\phi1$ and the signals $\phi1'$, ... and $\phi1''$ each obtained on delaying $\phi1$ by a delay element and giving a phase difference thereto. Thus, a delay is generated from when the decision output signal $\phi1$ transitions from high to low to when the operation of the charge pump circuit 3 is stopped. In FIG. 6A, Td1 (a delay time generated from when the transition of the signal $\phi1$ to the transition of the signal $\phi1''$) indicates this delay.

In this case, as indicated by a broken line in FIG. 7, there is a problem that a variation in the boosted voltage becomes large. FIG. 7 is a diagram newly created to explain more plainly the problem of the conventional booster circuit, and is a diagram showing a temporal transition of the boosted voltage. The broken line in FIG. 7 shows an influence caused by the delay indicated by reference numeral Td1 in FIG. 6A.

Further, phase differences of the decision output signals $\phi1$, $\phi1'$, ... and $\phi1''$ are generated by delay times of the delay elements, respectively, so that there is a problem that the booster circuit is influenced by manufacturing variations.

Further, when the delay time from the signal $\phi1$ to the signal $\phi1''$ with respect to a period of the oscillation circuit 21 is large, timings of the signals $\phi3$ and $\phi3''$ may overlap with timings t1, t2, t3, and so on, as shown in FIG. 6B. The charge pump circuits 3 will thus operate at the same time. For this reason, there is a problem that a current peak increases.

The invention disclosed in this application is generally configured as follows.

A booster circuit according to one aspect (aspect) of the present invention includes:

an oscillation circuit for receiving a control signal controlling whether to perform oscillation or not, causing an odd number of stages of inverters thereof to constitute a closed path when the control signal is indicative of the oscillation, thereby extracting oscillation outputs from output terminals of the inverters individually, and controlling inverting operations of the inverters to stop oscillation when the control signal is indicative of non-oscillation; and a plurality of charge pump circuits for receiving the oscillation outputs from the oscillation circuit as clocks, respectively, for operation.

In the booster circuit according to the present invention, when the control signal is indicative of the non-oscillation, output values of the inverters in the oscillation circuit are not inverted and held, and the oscillation is thereby stopped.

It may be so arranged that in the booster circuit according to the present invention, while the control signal is indicative of the non-oscillation, outputs of the inverters are held at values of the outputs of the inverters at the time point when the control signal has transitioned from a level indicating the oscillation to a level indicating the non-oscillation, and the oscillation is thereby stopped.

It may be so arranged that in the booster circuit according to the present invention, while the control signal is indicative of the non-oscillation, an input and an output of each of the inverters are maintained at a relationship between the input and the output of each of the inverters at the time point when the control signal has transitioned from a level indicating the oscillation to a level indicating the non-oscillation, and the oscillation is thereby stopped.

The meritorious effects of the present invention are summarized as follows.

According to the present invention, control over suspension of the oscillation circuit and resumption of the oscillation circuit is enabled. Simultaneous stopping of operations of the charge circuits and smooth resumption of the operations of the charge circuits can be thereby performed. As a result, voltage boosting accuracy can be improved.

According to the present invention, a possibility that phases of a plurality of charge pump control signals are overlapped is eliminated, so that occurrence of an increase in a current peak caused by manufacturing variations or the like is suppressed.

BRIEF DESCRIPTIONS OF THE DRAWINGS

FIG. 1 is a diagram showing a configuration of an embodiment of the present invention;

PREFERRED EMBODIMENTS OF THE INVENTION

Figures 2A, 2B:
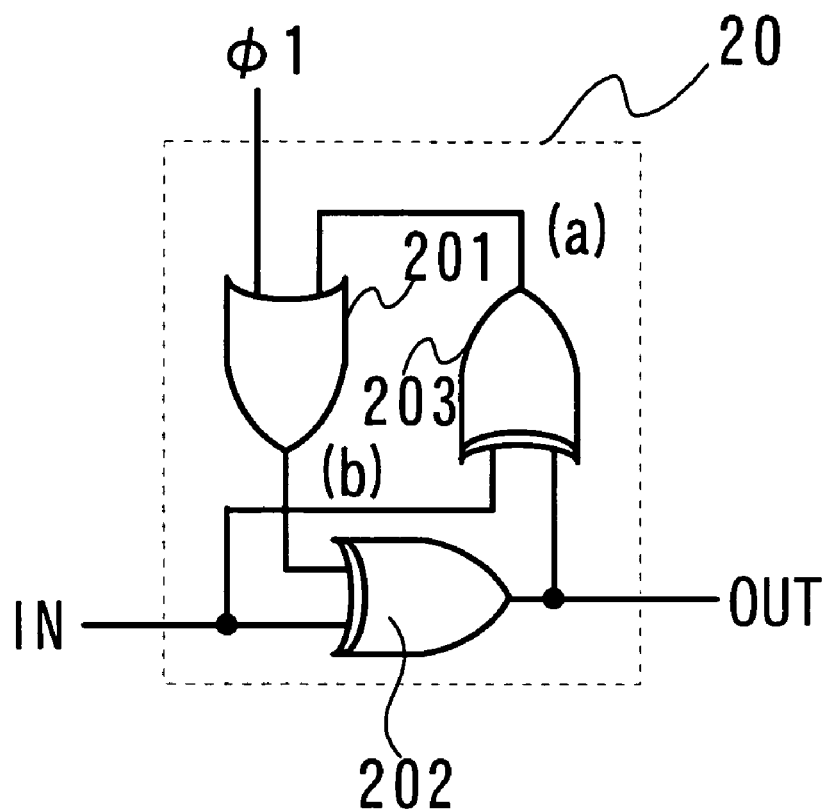
FIG. 2A is a diagram showing a circuit configuration of a control-type inverter.
FIG. 2B is a diagram showing an operation of the control-type inverter.

A description will be given below with reference to appended drawings in order to describe the present invention described above in further detail. The present invention includes a voltage detection circuit (1) for detecting a boosted voltage, an oscillation circuit (2), and a plurality of charge pump circuits (3). The oscillation circuit (2) includes an odd number of stages of control-type inverters (20). When a control signal ($\phi1$) from the voltage detection circuit (1) indicates oscillation (execution of a voltage boosting operation), the odd number of the stages of inverters constitute a closed path. Oscillation outputs ($\phi4$, $\phi4'$, ..., and $\phi4''$) are extracted from outputs of the control-type inverters (20), and supplied to the charge pump circuits (3) as clock signals. On the other hand, when the control signal (1) indicates an oscillation stop (stop of the voltage boosting operation), output values of the control-type inverters (20) are not inverted and held. For this reason, the oscillation is stopped. The output signals ($\phi4$, $\phi4'$, ..., and $\phi4''$) of the oscillation circuit (2) are held to be the output hold values of the control-type inverters (20) and not oscillated. Operations of the charge pump circuits (3) are thereby stopped. In the present invention, there are some variations for a configuration of each control-type inverter (20) of the oscillation circuit. A description will be given below in connection with embodiments.

Figure 8:
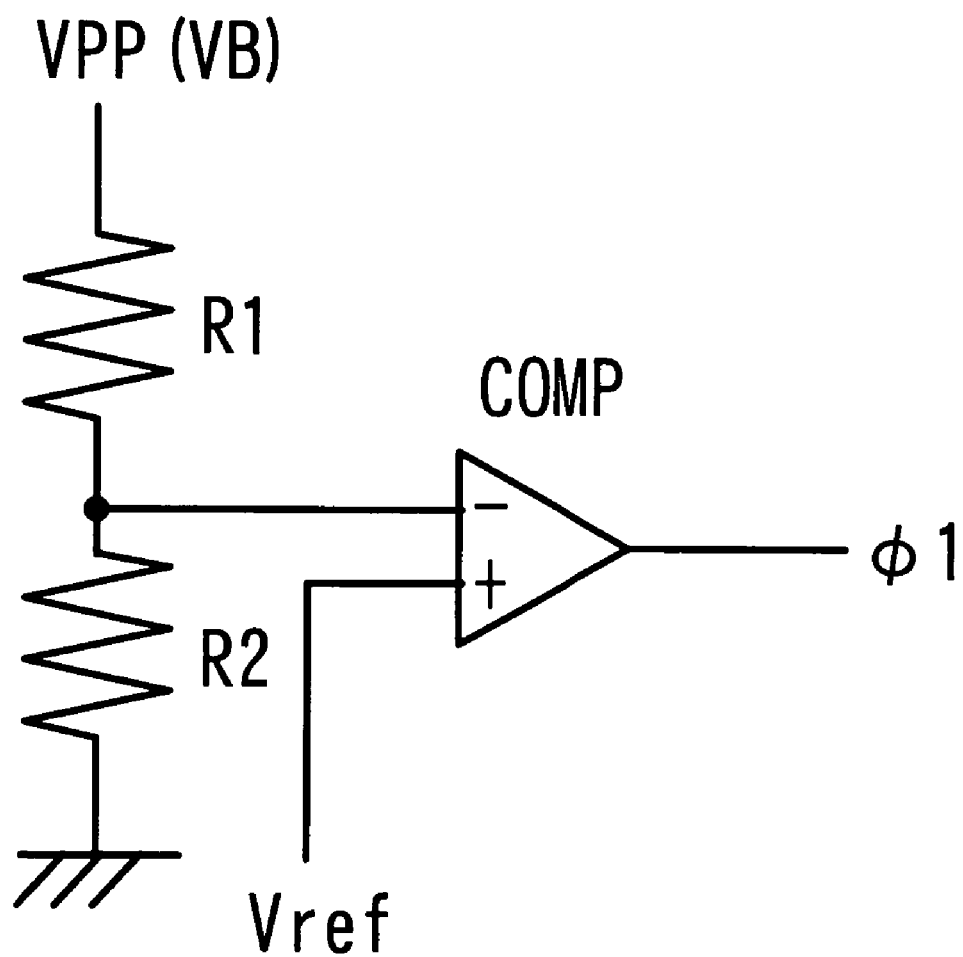
FIG. 8 is a diagram showing an example of a configuration of a voltage detection circuit.
Figure 9:
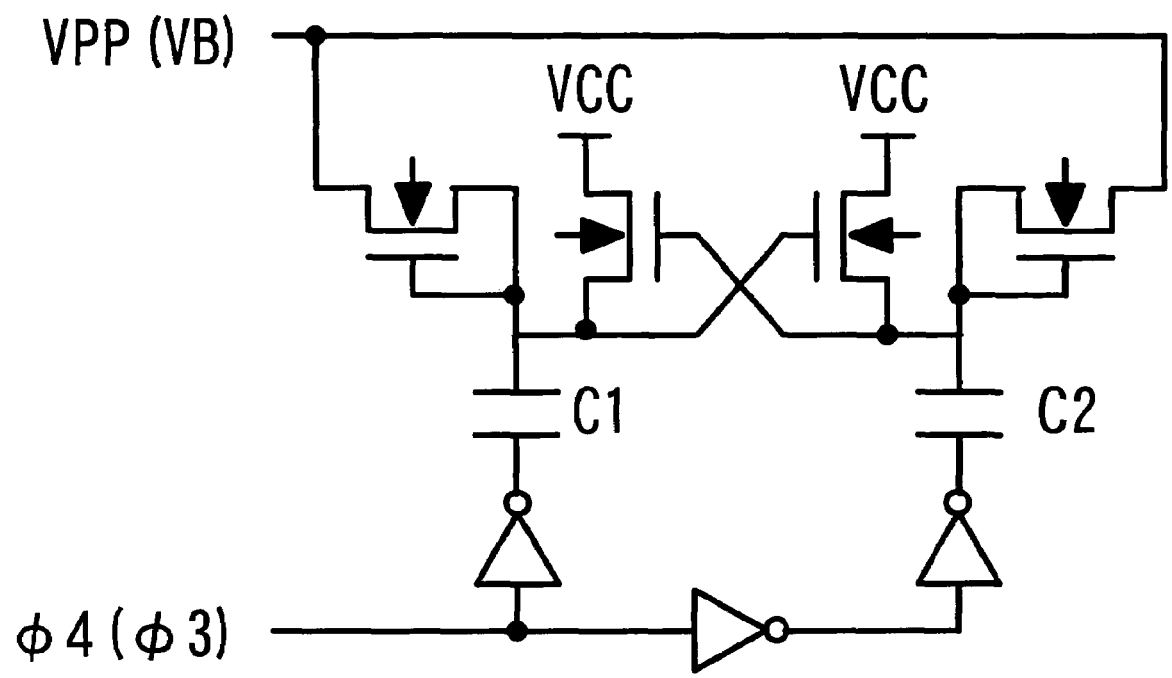
FIG. 9 is a diagram showing an example of a configuration of a charge pump circuit.

FIG. 1 is a diagram showing the configuration of a booster circuit according to an embodiment of the present invention. Referring to FIG. 1, the booster circuit in the present embodiment includes a voltage detection circuit 1 for detecting a boosted voltage VPP and outputting the decision output signal $\phi1$ for controlling the voltage boosting operation, an oscillation circuit 2, and a plurality of charge pump circuit 3 that operate responsive to respective output signals $\phi4$, $\phi4'$, ..., and $\phi4''$ having mutually different phases and output from the oscillation circuit 2. The oscillation circuit 2 receives the decision output signal $\phi1$ from the voltage detection circuit 1, and control over an oscillating operation and the oscillation stop is performed based on a value of the decision output signal $\phi1$. Since the voltage detection circuit 1 and the charge pump circuits 3 in FIG. 1 have the same configurations as shown in FIGS. 8 and 9, respectively, a description thereof will be omitted.

When the decision output signal $\phi1$ indicates the oscillating operation, the oscillation circuit 2 is configured as a ring oscillator constituted from a closed circuit in which the odd number of the stages of control-type inverters 20 are cascade-connected, and an output of the final stage is fed back to the first stage. More specifically, referring to FIGS. 1 and 2, each of the control-type inverters 20 includes a logical OR (OR) circuit 201 for receiving the decision output signal $\phi1$ at one input terminal thereof, an exclusive OR (EXOR) circuit 202 for receiving an input signal IN of the control-type inverter 20 and an output signal of the OR circuit 201, and an exclusive OR (EXOR) circuit 203 for receiving an output signal OUT of the exclusive OR (EXOR) circuit 202 and the input signal IN. An output signal of the EXOR circuit 203 is supplied to the other input terminal of the OR circuit 201. An operation of the control-type inverter 20 will be described.

When the decision output signal $\phi1$ indicates one (a high level in positive logic, for example), an output of the OR circuit 201 becomes one, irrespective of an output value of the EXOR circuit 203. The EXOR circuit 202 functions as an inverter, so that the EXOR circuit 202 outputs a result of inversion of the input signal IN as an output OUT, thereby functioning as an inverting circuit.

When the decision output signal φ1 indicates zero (a low level in positive logic, for example), the output of the OR circuit 201 becomes an output of the EXOR circuit 203. In this case, when the input signal IN indicates one and the output signal OUT indicates zero (OUT=/IN, in which /indicates inversion), the output of the EXOR circuit 203 becomes one, and the OR circuit 201 outputs one. Then, an output of the EXOR circuit 202 becomes zero, so that the output signal OUT becomes an inverted signal of the input signal IN. OUT=/IN is thereby maintained.

When the input signal IN indicates zero and the output signal OUT indicates one (OUT=/IN), the output of the EXOR circuit 203 becomes one. Then, the OR circuit 201 outputs one, and the output OUT of the EXOR circuit 202 becomes one. The output signal OUT becomes the inverted signal of the input signal IN, so that OUT=/IN is maintained.

When the input signal IN indicates one and the output signal OUT indicates one (OUT=IN), the output of the EXOR circuit 203 becomes zero. Then, the OR circuit 201 outputs zero, and the output of the EXOR circuit 202 becomes one. OUT=IN is thus maintained.

When the input signal IN indicates zero and the output signal OUT indicates zero (OUT=IN), the output of the EXOR circuit 203 becomes zero. Then, the OR circuit 201 outputs zero, and the output of the EXOR circuit 202 becomes zero. OUT=IN is thus maintained.

As described above, when the decision output signal φ1 is high, the output signal OUT becomes the inverted signal of the input signal IN (OUT=/IN). The EXOR circuit 202 thereby functions as the inverter (refer to FIG. 2B).

On the other hand, when the decision output signal φ1 is low, and when inversion of the output signal OUT has been completed at the time point when the decision output signal φ1 transitions from high to low, OUT=/IN is maintained. When the decision output signal φ1 is low and when inversion of the output signal OUT has not been completed at the time when the decision output signal φ1 transitions from high to low (depending on a propagation delay of the EXOR circuit 202), OUT=IN is maintained. Accordingly, the output signal OUT is held, irrespective of an operating condition of the inverter. That is, when the decision output signal φ1 is low, the value of the output OUT of the control-type inverter is fixed and held at a value at the point of time when the decision output signal φ1 transitions from high to low.

Next, a control operation of the circuit in FIG. 1 will be described. When it is found in the voltage detection circuit 1 that the boosted voltage has not reached the set voltage, the decision output signal φ1 goes high. The oscillation circuit 2 becomes the closed circuit of the control-type inverters 20. The output signals φ4, φ4', and φ4" from the oscillation circuit 2 (signals from respective stages of the ring oscillator) become oscillation signals with phase differences provided depending on inversion time of each control-type inverter 20 (propagation delay time from the input of the input signal IN to the output of the inverted signal OUT). A phase difference between the signals φ4 and φ4' is defined by the propagation delay time between the EXOR circuits 202 of the control-type inverters 20 constituting the ring oscillator).

Upon receipt of the output signals φ4, φ4', ..., and φ4" from the oscillation circuit 2 as clock signals, the charge pump circuits 3 perform the voltage boosting operations.

On the other hand, when it is determined in the voltage detection circuit 1 that the boosted voltage has reached the set voltage, the decision output signal φ1 transitions from high to low. For this reason, outputs of all the control-type inverters 20 in the oscillation circuit 2 are held. More specifically, as described before, while the decision output signal φ1 is low, an output of each control-type inverter 20 is held at an output value of the EXOR circuit 202 at the point of the time when the decision output signal φ1 transitions from high to low. For this reason, when the decision output signal φ1 is low, the output signals φ4, φ4', ..., and φ4" from the oscillation circuit 2 are continued to be held at the output hold values of the control-type inverters 20 (at the high level or the low level). Oscillation is thereby stopped, and none of the charge pump circuits 3 are driven by the clocks, so that the charge pump circuits 3 stop voltage boosting operations.

Figure 3:
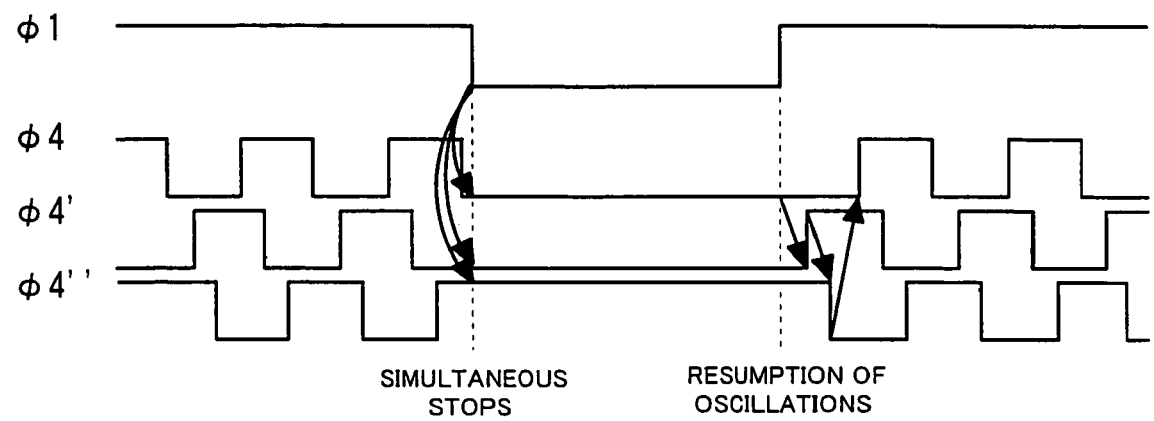
FIG. 3 is a timing chart showing an operation of a booster circuit according to the embodiment of the present invention.

FIG. 3 is a timing diagram for explaining an operation of the present embodiment. When the decision output signal φ1 transitions from high to low as shown in FIG. 3, values of the output signals φ4, φ4', ... and φ4" of the control-type inverters 20 in the oscillation circuit 2 are all held. Thus, the charge pump circuits 3 with operations thereof controlled by the output signals φ4, φ4', ..., and φ4", respectively, stop the voltage boosting operations.

When the decision output signal φ1 transitions from low to high again, the control-type inverters 20 of the oscillation circuit 2 operate as the inverters. At this point, oscillations of the output signals φ4, φ4', ..., and φ4" from the control-type inverters 20 with input and output levels thereof held to be equal (OUT=IN) are resumed, so that the charge pump circuits 3 perform the voltage boosting operations, respectively, using the output signals φ4, φ4', ..., and φ4" as the clocks.

By the control operation described above, unnecessary voltage boosting will not be performed in the present embodiment.

Then, in the present embodiment, a phase difference between each of the outputs φ4, φ4', ..., and φ4" of the oscillation circuit 2 are obtained by dividing an oscillation period of the oscillation circuit 2 (which corresponds to the propagation delay time of the EXOR circuit 202). Thus, timings of the signals φ4, φ4', ..., and φ4" of the oscillation circuits 2 will not overlap. Accordingly, in the present embodiment, simultaneous operations of the charge pump circuits 3 are avoided with reliability. As a result, according to the present embodiment, a possibility of an increase in a peak current is suppressed.

Figure 4:
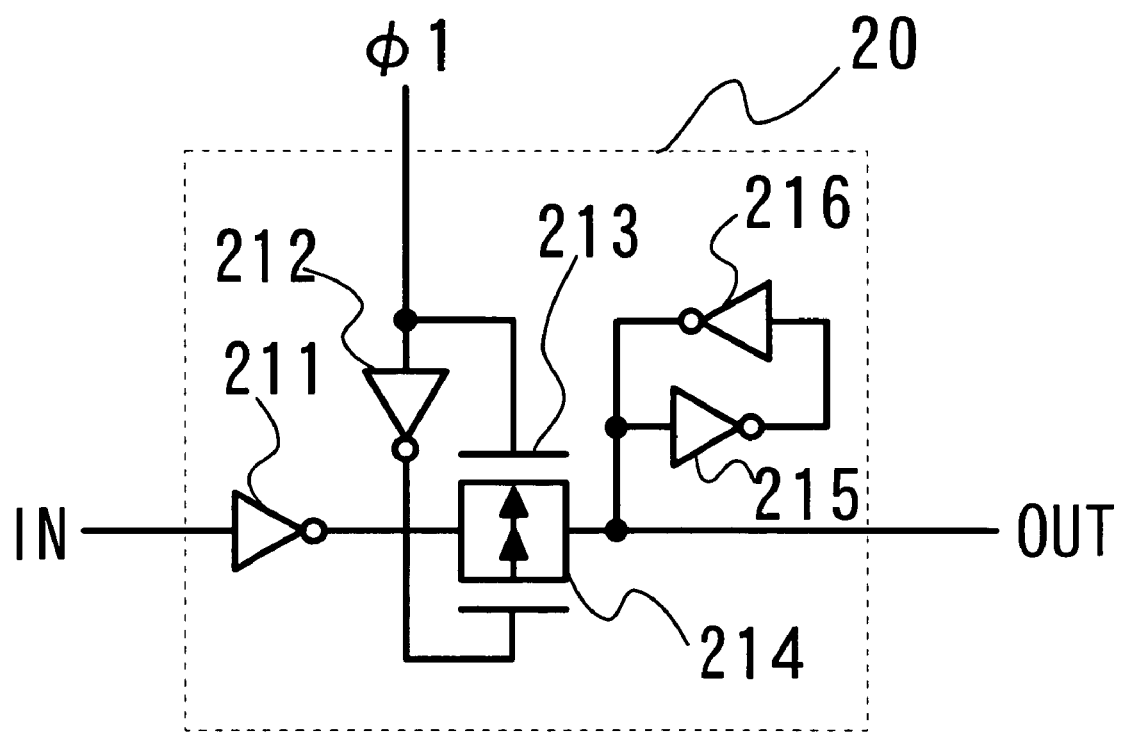
FIG. 4 is a diagram showing an example of another configuration of the control-type inverter.
Figure 5:
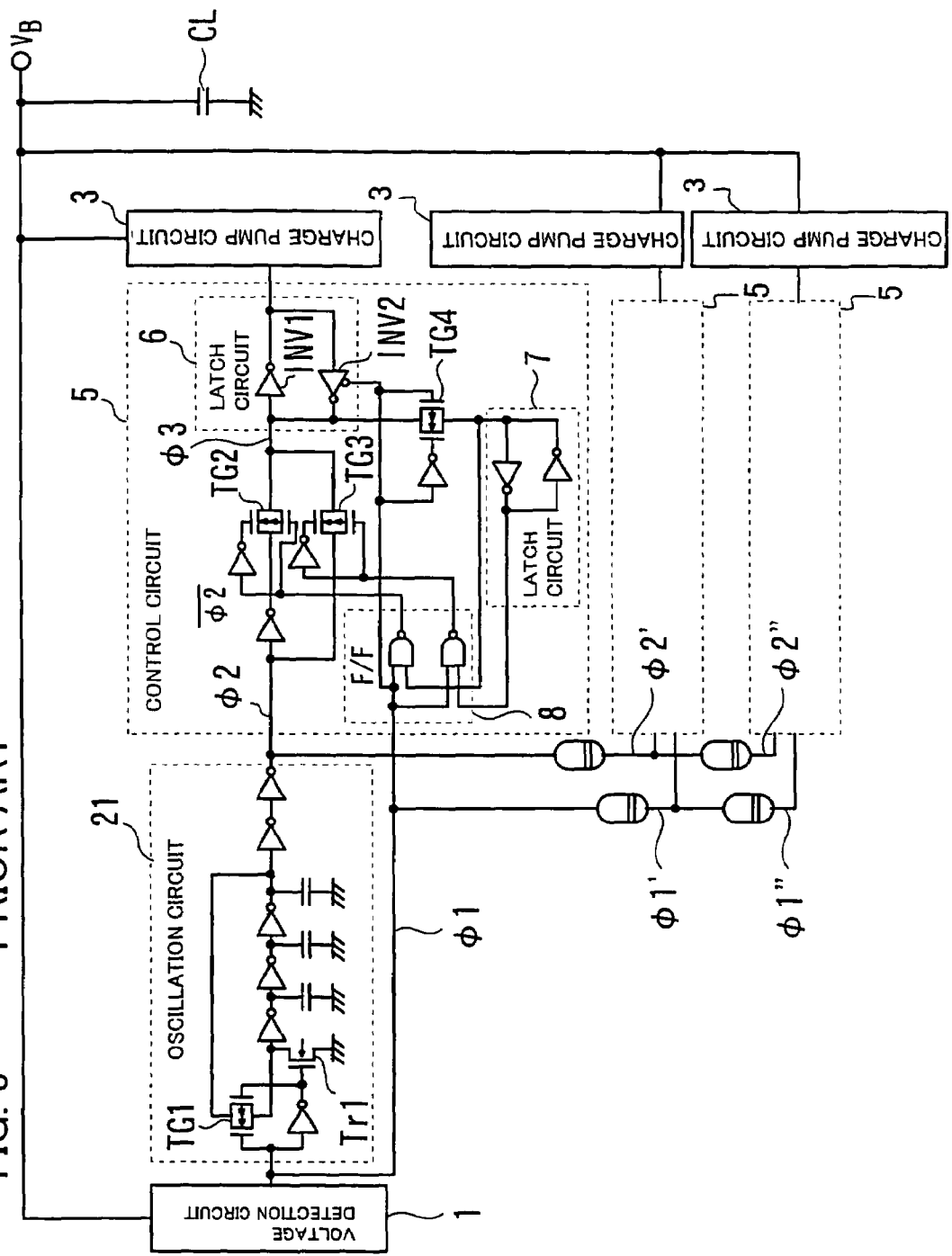
FIG. 5 is a diagram showing a configuration of a booster circuit in Patent Document 1.
Figure 6A:
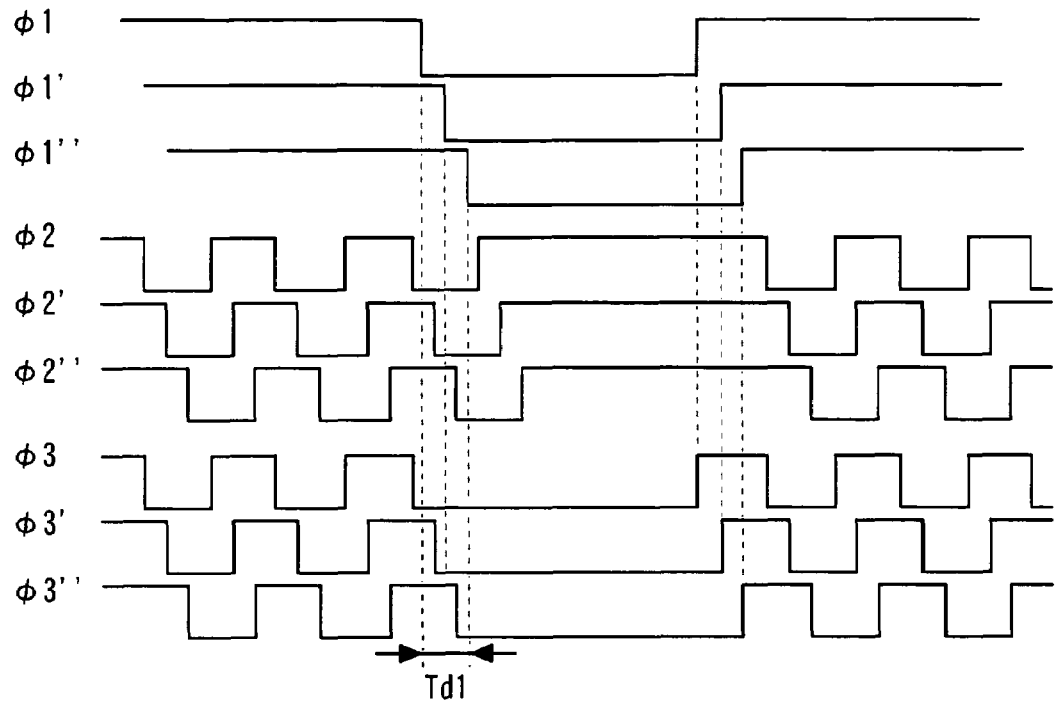
FIG. 6A is a diagram showing an operation of a conventional booster circuit.
Figure 6B:
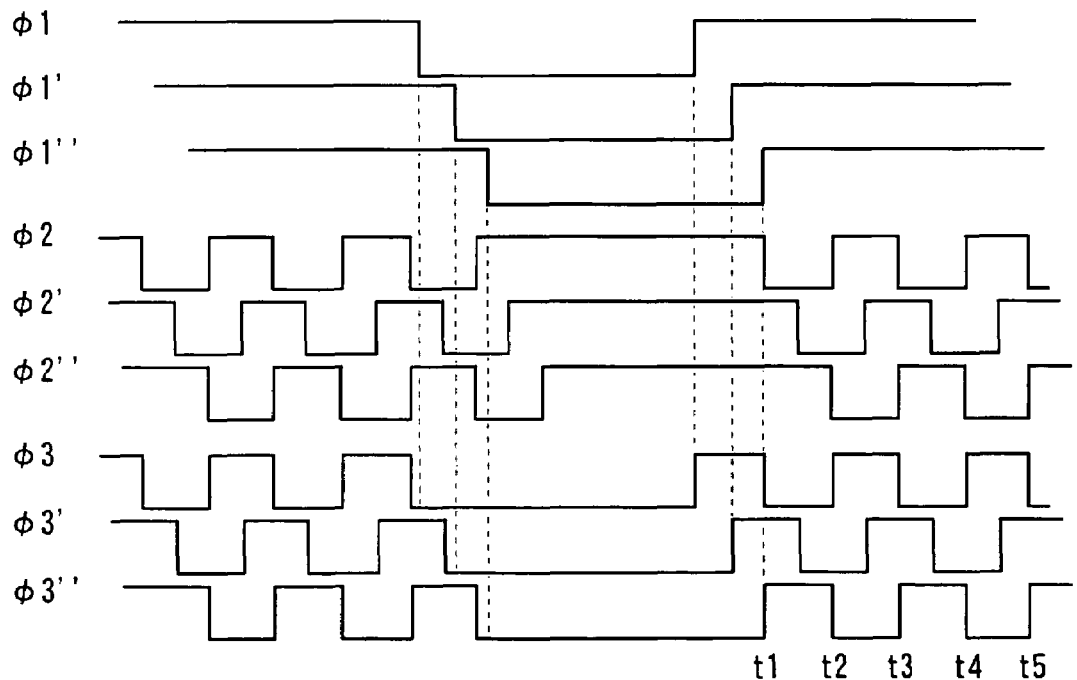
FIG. 6B is a diagram showing an operation of the conventional booster circuit.
Figure 7:
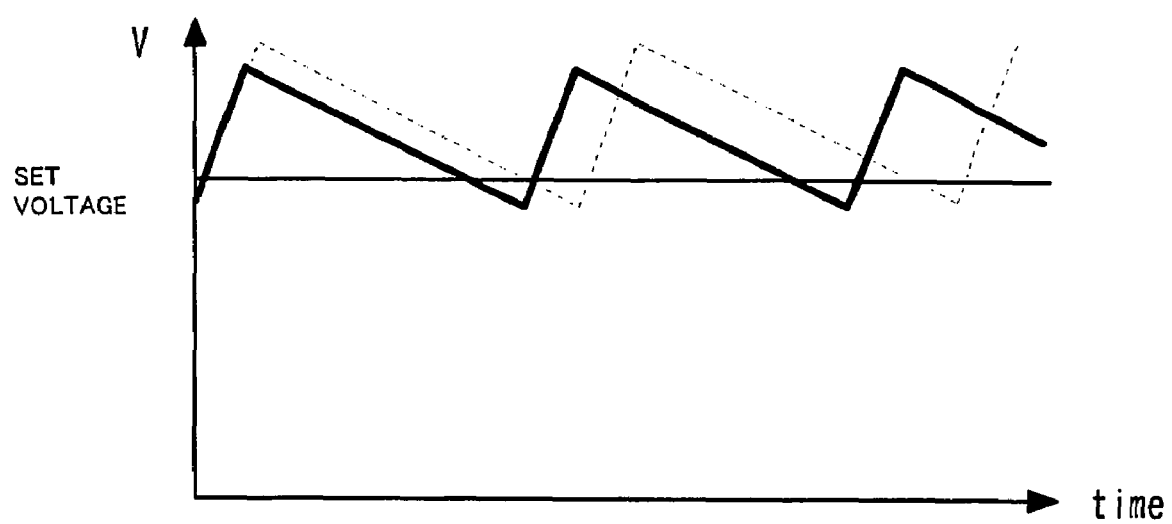
FIG. 7 is a diagram showing a temporal transition of a boosted voltage.

Another embodiment of the present invention will be described. The control-type inverter 20 in the oscillation circuit 2 in FIG. 1 may have a configuration as shown in FIG. 4. Referring to FIG. 4, in this control-type inverter 20, a latch circuit (constituted from a transfer gate and a flip-flop) that receives the decision output signal φ1 from the voltage detection circuit 1 as a latch control signal is disposed for an output of an inverter 211. When the decision output signal φ1 is high, the latch circuit outputs an output of the inverter 211 without alteration (however with the output held in the flip-flop). When the decision output signal φ1 is low, the latch circuit outputs the value held in the flip-flop irrespective of a value of the input signal IN because the transfer gate turns off. More specifically, the control-type inverter includes the inverter 211 for inverting the input signal IN, the transfer gate connected between the input signal IN and the output signal OUT and constituted from an NMOS transistor 213 and a PMOS transistor 214, and inverters 215 and 216 with an input of the inverter 215 connected to an output of the inverter 216 and an output of the inverter 215 connected to an input of the inverter 216, for latching the output signal OUT. The NMOS transistor 213 receives the decision output signal φ1 of the voltage detection circuit 1 at a gate thereof. The PMOS transistor 214 receives a signal obtained by inversion of the decision output signal φ1 by an inverter 212 at a gate thereof. The transfer gate (constituted from the transistors 213 and 214) turns on and off when the decision output signal φ1 is high and low, respectively.

When the decision output signal φ1 is high, the transfer gate (constituted from the transistors 213 and 214) turns on, and an output at this point is held in a flip-flop circuit (constituted from the inverters 215 and 216). On the other hand, when the decision output signal φ1 is low, the transfer gate (constituted from the transistors 213 and 214) turns off, and a level held at the flip-flop circuit (constituted from the inverters 215 and 216) is output. At this point, the inverter 216 outputs a level of the signal that has been obtained on inverting the value of the input signal IN immediately before the decision output signal φ1 goes low, by the inverter 211 and transferred through the transfer gate (constituted from the transistors 213 and 214), as the output signal OUT (OUT=/ IN).

The oscillation circuit 2 operates in the same manner as in the embodiment described before with reference to FIG. 3 also when the control-type inverters 20 in FIG. 4 are employed in the oscillation circuit 2 in FIG. 1. That is, when it is determined in the voltage detection circuit 1 that the boosted voltage has not reached the set voltage, the decision output signal φ1 goes high. The oscillation circuit 2 becomes the closed circuit of the odd number of the stages of the control-type inverters 20. Accordingly, the output signals φ4, φ4', and φ4" from the oscillation circuit 2 become oscillation signals with the phase differences provided according to the inversion times of the respective control-type inverters 20. Upon receipt of the output signals φ4, φ4', and φ4" of the oscillation circuit 2, the charge pump circuits 3 operate respectively, thereby performing voltage boosting. When it is determined in the voltage detection circuit 1 that the boosted voltage has reached the set voltage, the decision output signal φ1 goes low, and levels held in the latch circuits in the control-type inverters 20 (refer to FIG. 4) are output from the control-type inverters 20 of the oscillation circuit 2, respectively. Accordingly, oscillations of the output signals φ4, φ4', and φ4" of the oscillation circuit 2 are stopped, so that the voltage boosting by the charge pump circuits 3 is also stopped. When the decision output signal φ1 transitions from low to high, the control-type inverters in the oscillation circuit 2 operate as the inverters. Thus, oscillations from the output signals φ4, φ4', and φ4" from the control-type inverters 20 with input and output levels thereof held to be the same are resumed. The voltage boosting operations of the charge pump circuits 3 are thereby resumed.

When the booster circuit in the present embodiment described above is employed for an LSI such as a non-volatile memory, suspension of the oscillation circuit becomes possible by operation control over the control-type inverters of the oscillation circuit. Further, voltage boosting control capable of avoiding the influence of delays generated by phase division targeted for peak current distribution can be obtained. That is, according to the present embodiment, a phase difference at a time of the phase division is obtained by dividing an oscillation period of the oscillation circuit. Thus, clock timings of the outputs of the oscillation circuit will not overlap, thereby contributing the peak current distribution.

The above description was given in connection with the embodiments described above. The present invention is not limited to the configurations of the embodiments described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A booster circuit comprising:
    an oscillation circuit including an odd number of a plurality of stages of controllable inverters, said oscillation circuit for receiving a control signal controlling whether to perform oscillation or not, and for setting by said control signal being input to each of said odd number of stages of controllable inverters to constitute a closed path with a plurality of oscillation output signals being output from respective output terminals of said controllable inverters when the control signal is indicative of the oscillation, while said oscillation circuit controlling inverting operations of said controllable inverters to stop oscillation when the control signal is indicative of non-oscillation; and
    a plurality of charge pump circuits for receiving said plurality of oscillation output signals from said oscillation circuit as clocks, respectively, for operation.

2. The booster circuit according to claim 1, wherein, when the control signal is indicative of the non-oscillation, output values of said inverters in said oscillation circuit are not inverted and held, and the oscillation is thereby stopped.

3. The booster circuit according to claim 1, wherein, when the control signal is indicative of the non-oscillation, outputs of said inverters in said oscillation circuit are held at respective values of the outputs of said inverters at the time point when the control signal has transitioned from a level indicating the oscillation to a level indicating the non-oscillation, and the oscillation is thereby stopped.

4. The booster circuit according to claim 1, wherein, when the control signal indicates non-oscillation, an input and an output of each of said inverters in said oscillation circuit are maintained at a level between the input and the output of said each of said inverters at a time point when the control signal transitions from indicating the oscillation to indicating the non-oscillation, and the oscillation is thereby stopped.

5. The booster circuit according to claim 1, wherein each of said inverters in said oscillation circuit comprises:
    first and second logic circuits, each for outputting first and second logic values, when signals input to two input terminals thereof match with each other and do not match with each other, respectively; and
    a third logic circuit for receiving the control signal and an output signal of the second logic circuit, for outputting the second logic value when the control signal and the output signal of the second logic circuit both are of the second logic value, and for outputting the first logic value otherwise;
    the first logic circuit receiving an output signal of the third logic circuit and an input signal supplied to said inverter, and an output signal of the first logic circuit being output as an output signal of said inverter;
    the second logic circuit receiving the input signal supplied to said inverter and the output signal of the first logic circuit; wherein,
    when the control signal assumes the first logic value and is indicative of the oscillation, the first logic circuit functions as the circuit for inverting the input signal, for output; and when the control signal assumes the second logic value and is indicative of the non-oscillation, the inputs and the output of the first logic circuit are held at values of the inputs and the output of the first logic circuit at the time point when the control signal has transitioned from the first logic value to the second logic value, through the second and third logic circuits.

6. The booster circuit according to claim 1, wherein said oscillation circuit includes a latch circuit corresponding to each of said inverters, for receiving an output of the corresponding inverter;

said latch circuit outputting the output of the corresponding inverter without alteration, and storing and holding the output of the corresponding inverter when the control signal is indicative of the oscillation, while said latch circuit outputting a value stored and held in the latch circuit, irrespective of the output of the corresponding inverter, when the control signal is indicative of a stop of the oscillation.

7. The booster circuit according to claim 1, further comprising:

a voltage detection circuit for comparing the boosted voltage with a predetermined set voltage, and outputting a decision output signal for controlling a voltage boosting operation;

said oscillation circuit receiving the decision output signal output from said voltage detection circuit as the control signal for controlling whether to perform the oscillation or not.

8. A semiconductor device including said booster circuit as set forth in claim 1.

9. The booster circuit according to claim 1, wherein each of said controllable inverters comprises:

an OR circuit;

a first EXOR circuit adapted to receive an output of the OR circuit; and a second EXOR circuit adapted to receive an output of the first EXOR circuit, and an output of the second EXOR circuit is input to the OR circuit.

10. The booster circuit according to claim 9, wherein the control signal is input to the OR circuit.

11. The booster circuit according to claim 9, wherein an output of a last of said odd number of controllable inverters is input to the first EXOR circuit of a first of said odd number of controllable inverters.

12. A booster circuit, comprising:

a voltage detection circuit adapted to output a decision output signal;

an oscillation circuit adapted to receive the decision output signal controlling whether to perform oscillation or not, said oscillation circuit including an odd number of a plurality of stages of controllable inverters, and each stage includes:

an OR circuit, a first EXOR circuit adapted to receive an output of the OR circuit, and a second EXOR circuit adapted to receive an output of the first EXOR circuit, and an output of the second EXOR circuit is input to the OR circuit; and a plurality of charge pump circuits for receiving a plurality of oscillation output signals from said oscillation circuit as clocks, respectively, for operation.

13. The booster circuit according to claim 12, wherein the decision output signal is input to the OR circuit.

14. The booster circuit according to claim 12, wherein an output of a last of said odd number of controllable inverters is input to the first EXOR circuit of a first of said odd number of controllable inverters.

15. The booster circuit according to claim 12, wherein the decision output signal is input to each of said controllable inverters.

* * * * *